United States Patent [19]
Akatsu

[11] Patent Number: 6,039,055
[45] Date of Patent: Mar. 21, 2000

[54] WAFER CLEANING WITH DISSOLVED GAS CONCENTRATION CONTROL

[75] Inventor: Hiroyuki Akatsu, Yorktown Heights, N.Y.

[73] Assignee: International Business Machines Corporation, Armonk, N.Y.

[21] Appl. No.: 09/004,691

[22] Filed: Jan. 8, 1998

[51] Int. Cl.[7] ....................................... B08B 6/00
[52] U.S. Cl. .................. 134/1.3; 134/25.4; 134/56 R; 134/184; 134/902
[58] Field of Search ...................... 134/1.3, 25.4, 134/56 R, 58 R, 100.1, 184, 902

[56] References Cited

U.S. PATENT DOCUMENTS

| | | | |
|---|---|---|---|
| 4,662,210 | 5/1987 | D'Aoust | 73/19 |
| 4,865,060 | 9/1989 | Shibano | 134/60 |
| 4,907,611 | 3/1990 | Shibano | 134/60 |
| 4,931,225 | 6/1990 | Cheng | 261/76 |
| 5,000,795 | 3/1991 | Chung et al. | 134/37 |
| 5,014,727 | 5/1991 | Aigo | 134/102.2 |
| 5,121,627 | 6/1992 | D'Aoust | 73/19.05 |
| 5,144,831 | 9/1992 | Hale et al. | 73/19.05 |
| 5,176,756 | 1/1993 | Nakashima et al. | 134/2 |
| 5,279,316 | 1/1994 | Miranda | 134/102.1 |
| 5,306,350 | 4/1994 | Hoy et al. | 134/22.14 |
| 5,415,191 | 5/1995 | Mashimo et al. | 134/102.1 |
| 5,514,253 | 5/1996 | Davis et al. | 205/782.5 |
| 5,608,167 | 3/1997 | Hale et al. | 73/715 |
| 5,616,826 | 4/1997 | Pellaux et al. | 73/24.02 |
| 5,656,097 | 8/1997 | Olesen et al. | 134/1 |
| 5,681,396 | 10/1997 | Madanshetty | 134/1.3 |
| 5,800,626 | 9/1998 | Cohen et al. | 134/1.3 |

*Primary Examiner*—Randy Gulakowski
*Assistant Examiner*—Yolanda E. Wilkins
*Attorney, Agent, or Firm*—Steven Capella

[57] ABSTRACT

The improved methods and apparatus for cleaning semiconductor wafers and other planar substrates using megasonic cleaning are characterized by the use of monitoring of gas content (i) the liquid flowing to the megasonic cleaning environment, (ii) the liquid in the megasonic cleaning environment, and/or (iii) liquid leaving the megasonic cleaning environment. The methods use information obtained from directly monitoring of the gas content to control the supply of gas-containing liquid to the wafer-cleaning environment to achieve improved cleaning performance on the application of megasonic energy to the cleaning liquid. The gas content information may be used to control the supply of gas containing liquid in real time or may be used to pre-program the controller to achieve a desired gas content in the cleaning bath liquid.

10 Claims, No Drawings

WAFER CLEANING WITH DISSOLVED GAS CONCENTRATION CONTROL

BACKGROUND OF THE INVENTION

With decreasing feature size and more intricate fabrication techniques for wafer-based integrated circuit chips, wafers and the resulting integrated circuit chips have become increasingly sensitive to extraneous or unwanted material on the wafer/chip surface during and after processing. The presence of these unwanted materials either at intermediate fabrication stages or at the end of manufacture often adversely affects product performance reliability. Lack of adequate control of these unwanted materials can result in a loss of yield (reliable chips) and/or the failure of products in use.

Unwanted materials on the wafer/chip surface can be introduced from the external environment (e.g. dust in the air). More often however, unwanted material is introduced as a result of chip fabrication steps which cause deposition of unwanted material on the wafer surface. For example, chemical mechanical polishing (CMP) processes are used to planarize wafers and/or to planarize layers deposited on the wafers (e.g., polycrystalline silicon, tetraethylorthosilicate (TEOS), etc.). Frequently, residual material detached from the wafer in the course of CMP processes remains on the wafer surface as debris. CMP polishing particles may also remain on the wafer surface after the CMP process step. Other unwanted materials may be introduced to the wafer surface during the course of processes such as chemical vapor deposition (CVD), wet etching or dry etching which are frequently used in the manufacture of integrated circuits.

The desire to control the amount of unwanted material on the wafer/chip surface during manufacture has led to the development of a variety of cleaning processes. Most cleaning processes involve the use of liquids which contact the wafer surface. In some instances, the liquid-based cleaning processes may be combined with mechanical cleaning processes (e.g. brushing off the wafer surface) or other cleaning processes. Mechanical energy has also been applied in the form of ultrasonic and/or megasonic energy applied to a cleaning fluid via transducers. The use of megasonic energy has been useful in providing improved cleaning and in lessening the need for concentrated cleaning solutions.

While the use of megasonic energy has provided benefits, there are instances where application of megasonic energy may result in damage to wafers. Also, there is a demand for still further improved cleaning performance, reduced cleaning time and reduced cleaning cost.

SUMMARY OF THE INVENTION

The invention provides improved methods for cleaning semiconductor wafers and other planar substrates which methods provide improved megasonic cleaning performance. The invention also provides apparatus for conducting the methods of the invention. The methods of the invention advantageously provide improved cleaning performance while avoiding or minimizing wafer damage and improving cleaning process cycle time.

In one aspect, the invention encompasses a method for megasonic cleaning of wafers, the method comprising:

(a) providing a container containing one or more wafers immersed in a first liquid, (b) providing a flow of second liquid to the container, the second liquid containing a controlled amount of dissolved gas(es), (c) directly monitoring the gas content of (i) the second liquid flowing to the container, (ii) the liquid in the container, and/or (iii) liquid leaving the container, and deriving a signal or signals corresponding to the monitored gas content, (d) providing the derived signal(s) to a controller, the controller being capable of adjusting the flow of the second liquid to the container and/or the gas content of the second liquid, (e) adjusting the flow of the second liquid to the container and/or gas content of the second liquid in response to the signal(s), and (f) applying (and/or adjusting the applied) megasonic energy to the liquid in the container whereby the wafer(s) are cleaned.

In another aspect, the invention encompasses a method for megasonic cleaning of wafers, the method comprising:

(a) providing a container containing a first liquid, (b) providing a flow of second liquid to the container, the second liquid containing a controlled amount of dissolved gas(es), (c) directly monitoring the gas content of (i) the second liquid flowing to the container, (ii) the liquid in the container, and/or (iii) liquid leaving the container, during step (b) as a function of time and at least one setting of a programmable controller, the controller being capable of automatically adjusting the flow rate of the second liquid to a container and/or gas content of the second liquid as a function of time, to derive at least one setting for the programmable controller whereby the controller is programmed to automatically adjust the flow rate to a container and/or gas content of the second liquid as a function of time, (e) further providing a container containing one or more wafers immersed in a liquid, (f) activating the programmed controller from step (c) to provide a further flow of second liquid to the container of step (e), (g) applying (and/or adjusting the applied) megasonic energy to the liquid in the container of step (e) to clean the wafer(s) provided in step (e).

Step (a) may further comprise providing one or more wafers immersed in the first liquid where it is desired to obtain the gas content information in the actual presence of wafers in step (c).

Preferably, a signal(s) derived from a gas content probe measuring the gas content of the container liquid with wafers present is also provided to a controller for the source of megasonic energy such that the megasonic energy input may be adjusted in response to the measured gas content of the liquid in the container. The first liquid in the container is preferably liquid from a previous cleaning step. The signal(s) from the gas content probe may also be used to control other aspects of the cleaning operation such as input of cleaning agents. The preferably the liquids are aqueous.

The invention further encompasses an apparatus for megasonic cleaning of wafers, the apparatus comprising:

(a) a container for containing one or more wafers immersed in a liquid, (b) means for providing a flow of second liquid to the container, the second liquid containing dissolved gas, (c) means for directly monitoring the gas content as a function of time of (i) the second liquid flowing to the container, (ii) the liquid in the container, and/or (iii) liquid leaving the container, (d) a programmable controller capable of automatically adjusting the flow rate of the second liquid to the container and/or the gas content of the second liquid as a function of time, and (e) means for applying megasonic energy to the liquid in the container.

The apparatus preferably further includes means for transmitting a signal(s) from the monitoring means to the controller for the second liquid or other device such as a controller for the means of applying megasonic energy.

These and other aspects of the invention are described in further detail below.

DETAILED DESCRIPTION OF THE INVENTION

The invention provides improved methods and apparatus for cleaning semiconductor wafers and other planar substrates using megasonic cleaning. The invention provides improved cleaning performance while avoiding or minimizing wafer damage and improving cleaning process cycle time.

The methods of the invention are generally characterized by the monitoring of gas content in the liquid environment (container) where the megasonic energy is to be applied by monitoring the gas content of (i) a liquid flowing to the container, (ii) the liquid in the container, and/or (iii) liquid leaving the container. The methods of the invention use information obtained from directly monitoring of the gas content in the cleaning liquid to control the supply of gas-containing liquid to the wafer-cleaning environment to achieve improved cleaning performance on the application of megasonic energy to the cleaning liquid. The information regarding gas content may be used to control the supply of gas-containing liquid in real time or may be used to pre-program the controller to achieve a desired gas content in the cleaning bath liquid.

Where the method of the invention involves real time use of the gas content information, the method preferably comprises:

(a) providing a container containing one or more wafers immersed in a first liquid, (b) providing a flow of second liquid to the container, the second liquid containing a controlled amount of dissolved gas(es), (c) directly monitoring the gas content of (i) the second liquid flowing to the container, (ii) the liquid in the container, and/or (iii) liquid leaving the container, and deriving a signal or signals corresponding to the gas content, (d) providing the signal(s) to a controller, the controller being capable of adjusting the flow and/or gas content of the second liquid to the container, (e) adjusting the flow of the second liquid to the container and/or gas content of the second liquid in response to the signal(s), and (f) applying (and/or adjusting the applied) megasonic energy to the liquid in the container whereby the wafer(s) are cleaned.

Where the invention involves pre-programming a controller using the gas content information, the method preferably comprises:

(a) providing a container containing a first liquid, (b) providing a flow of second liquid to the container, the second liquid containing a controlled amount of dissolved gas(es), (c) directly monitoring the gas content of (i) the second liquid flowing to the container, (ii) the liquid in the container, and/or (iii) liquid leaving the container, during step (b) as a function of time and at least one setting of a programmable controller, the controller being capable of automatically adjusting the flow rate of the second liquid to a container and/or gas content of the second liquid as a function of time, to derive at least one setting for the programmable controller whereby the controller is programmed to automatically adjust, as a function of time, the flow rate of the second liquid to a container and/or the gas content of the second liquid, (e) further providing a container containing one or more wafers immersed in a liquid, (f) activating the programmed controller from step (c) to provide a further flow of second liquid to the container of step (e), (g) applying and/or adjusting megasonic energy to the liquid in the container of step (e) to clean the wafer(s) provided in step (e).

Step (a) may further comprise providing one or more wafers immersed in the first liquid where it is desired to obtain the gas content information in the actual presence of wafers in step (c).

The containers used may be any container normally used in wet cleaning of wafers in single wafer process, batch process or continuous process as are known in the art. See for example, U.S. Pat. Nos. 5,069,235; 5,089,084; 5,415,191; 5,556,479; 5,601,655; 5,651,379; 5,656,097; and 5,676,706, the disclosures of which are incorporated herein by reference. The liquid flows to the container may also be provided using means (pumps, valves, etc.) as are well known in the art.

The first liquid is preferably a liquid from a previous cleaning step or a starting deionized water. The second liquid is preferably a deionized water. The gas in the second liquid may be selected from any desired gas(es). The gas is preferably selected from the group consisting of nitrogen, oxygen, noble gas (e.g., argon, helium), ozone, hydrogen, $CO$, $CO_2$, $NH_3$, $NO_2$, $C_1$–$C_4$ hydrocarbons or fluorocarbons, $C_1$–$C_4$ ethers or fluorinated ethers, or combinations thereof.

The gas content of the second liquid and the liquid in the container may be varied considerably. The gas content is preferably between about 5% of saturation level up to supersaturation. More preferably, gas content of the second liquid and the liquid in the container is preferably below saturation level for the liquids used. The gas content of the liquid in the container is preferably at least about 10% of saturation level when megasonic energy is applied.

The second liquid may be a naturally gasified water or may be gasified using any conventional means. See for example U.S. Pat. Nos. 4,931,225 and 5,415,191, the disclosures of which are incorporated herein by reference. If desired, the gas content may be further adjusted by mixing liquids having different gas contents prior to input to the container.

The controller may be any conventional electronic or mechanical controller such as those described in the above mentioned patents. The controller is preferably adapted to control the second liquid by controlling one or more parameters such as flow rate to the container, flow rates of gas-containing liquid to a mixer, flow rate of gas to a gasifier, concentration of gas achieved in a degasifier, etc. Typically, the controller will interact electrically and/or mechanically with one or more known devices for performing these functions (e.g. valves, switches, pneumatic devices, etc.). The sophistication of the controller may range from a microcomputer to a simple timer-controlled switch, valve or relay. Preferably, the controller is capable of controlling the gas content and flow rate of the gas-containing liquid flowing to the container. If desired, a plurality of controllers may be used.

The gas content monitoring of (i) the second liquid flowing to the container, (ii) the liquid in the container, and/or (iii) liquid leaving the container is preferably performed using a probe or measuring device such as those manufactured by Orbisphere Inc. See also gas concentration monitoring devices described in U.S. Pat. Nos. 4,662,210 and 5,121,627, the disclosures of which are incorporated herein by reference. If desired, more than one monitoring device may be used or devices for detecting specific gases may be used. The information derived regarding gas content is preferably done as a function of time and of the relevant parameter settings of the controller. Preferably, the gas content of the liquid in the container is monitored.

The megasonic energy may be provided using any conventional megasonic transducer arrangement such as those described in U.S. Pat. Nos. 5,601,655 and 5,656,097. Preferably, a signal(s) derived from a gas content probe (or other measuring device) is also provided to a controller for the source of megasonic energy such that the megasonic energy input may be adjusted in response to the actual gas content (i) the second liquid flowing to the container, (ii) the liquid in the container, and/or (iii) liquid leaving the container, more preferably the gas content of the liquid in the container. The signal(s) from the gas content probe may also be used to control other aspects of the cleaning operation such as input of cleaning agents.

The method of the invention may be used at any point in a cleaning process where megasonic cleaning steps would normally be employed in cleaning semiconductor wafers or other planar objects (e.g. flat panels, LCD panels, etc.). For example, the invention may be used in combination with cleaning processes such as RCA cleans (SC-1 and SC-2), piranha cleans and other cleaning processes or rinsing steps such as those described in the above mentioned patents. See also the discussion of cleaning in "Fundamentals of Semiconductor Processing Technologies" by Badih El-Kareh, Kluwer Academic Publishers, 1995, pages 261–270.

What is claimed is:

1. A method for megasonic cleaning of wafers, the method comprising:
    (a) providing a container containing one or more wafers immersed in a first liquid,
    (b) providing a flow of second liquid to the container, the second liquid containing a controlled amount of dissolved gas,
    (c) directly monitoring the gas content of (i) the second liquid flowing to the container, (ii) the liquid in the container, and/or (iii) liquid leaving the container, and deriving a signal(s) corresponding to said monitored gas content(s),
    (d) providing said signal(s) to a controller, the controller being capable of adjusting the flow said second liquid to said container and/or gas content of the second liquid,
    (e) adjusting the flow of the second liquid to the container and/or gas content of the second liquid in response to the signal(s),
    (f) providing a source of megasonic energy and a controller for said source of megasonic energy, and transmitting said signal(s) to said controller for said source of megasonic energy, and
    (g) applying megasonic energy to the liquid in the container whereby the wafer(s) are cleaned.

2. The method of claim 1 wherein said first and second liquids contain deionized water.

3. The method of claim 1 wherein the liquid in said container during step (f) has a total gas content of at least about 10% of saturation level for the gas in said container liquid.

4. The method of claim 1 wherein said gas is selected from the group consisting of nitrogen, oxygen, noble gas, ozone, hydrogen, CO, $CO_2$, $NH_3$, $NO_2$, $C_1$–$C_4$ hydrocarbons or fluorocarbons, $C_1$–$C_4$ ethers or fluorinated ethers, or mixtures thereof.

5. The method of claim 1 wherein said signal(s) is an electrical signal(s).

6. The method of claim 1 wherein a plurality of wafers are immersed in said first liquid.

7. The method of claim 1 wherein said wafers are silicon-based semiconductor wafers.

8. An apparatus for megasonic cleaning of wafers, the apparatus comprising:
    (a) a container for containing one or more wafers immersed in a liquid,
    (b) means for providing a flow of second liquid to the container, the second liquid containing dissolved gas,
    (c) means for directly monitoring the gas content of (i) the second liquid flowing to the container, (ii) the liquid in the container, and/or (iii) liquid leaving the container, as a function of time,
    (d) a programmable controller capable of automatically adjusting the flow rate of the second liquid and/or the gas content of the second liquid as a function of time, and
    (e) means for applying megasonic energy to the liquid in the container, said means for providing megasonic energy including a programmable controller for controlling a source of megasonic energy, wherein said means for monitoring the gas content further includes means for transmitting a signal(s) from the monitoring means to said controller for said megasonic energy.

9. The apparatus of claim 8 wherein said means for monitoring the gas content further includes means for transmitting a signal(s) from the monitoring means to said flow rate controller.

10. The apparatus of claim 8 wherein said monitoring means is capable of simultaneously monitoring concentrations of a plurality of gases in said liquid.

* * * * *